(12) United States Patent  
Foote et al.

(10) Patent No.: US 8,268,675 B2  
(45) Date of Patent: Sep. 18, 2012

(54) PASSIVATION LAYER FOR SEMICONDUCTOR DEVICE PACKAGING

(75) Inventors: David Keating Foote, San Jose, CA (US); James Donald Getty, Vacaville, CA (US)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 13/025,717

(22) Filed: Feb. 11, 2011

(65) Prior Publication Data

US 2012/0208321 A1  Aug. 16, 2012

(51) Int. Cl.  
*H04L 21/00* (2006.01)

(52) U.S. Cl. ........... 438/115; 438/905; 257/E21.224; 257/E21.226; 257/E21.228; 257/E21.229; 257/E21.23

(58) Field of Classification Search ............... None  
See application file for complete search history.

(56) References Cited

U.S. PATENT DOCUMENTS

| | | | |
|---|---|---|---|
| 6,413,576 B1 * | 7/2002 | Ellis et al. | 438/785 |
| 6,933,614 B2 * | 8/2005 | Lee et al. | 257/780 |
| 2004/0161528 A1 * | 8/2004 | Martinez et al. | 427/2.24 |
| 2009/0099512 A1 | 4/2009 | DiGregorio et al. | |
| 2011/0011531 A1 * | 1/2011 | Schulte | 156/281 |

OTHER PUBLICATIONS

Grassine et al., "Advanced plasma treatment for cleaning and protecting precious metal artifacts", International Conference on Strategies for Saving Indoor Metallic Collections with a Satellite Meeting on Legal Issues in the Conservation of Cultural Heritage, pp. 127-131, Cairo-Egypt, Feb. 25-Mar. 1, 2007.*

Antonijevic et al., " Copper Corrosion Inhibitors, A review", Int. J. Electrochemi. Soc., 3, pp. 1-28, 2008.*

Lin et al., "Effect of Plasma Polymer Deposition Methods on Copper Corrosion Protection", J. of Applied Polymer Science, vol. 60, pp. 543-555, 1996.*

* cited by examiner

*Primary Examiner* — Charles Garber  
*Assistant Examiner* — Yasser Abdelaziez  
(74) *Attorney, Agent, or Firm* — Wood, Herron & Evans, LLP (57) ABSTRACT

Methods of protecting a surface of a copper layer or a copper bonding pad on a semiconductor device against oxidation. A surface of the layer or bonding pad is cleaned by removing an oxidation layer with a plasma. A polymer layer is formed on the cleaned surface of the layer using a plasma-enhanced deposition process to protect the cleaned surface of the layer against exposure to an oxidizing gas.

11 Claims, 6 Drawing Sheets

PASSIVATION LAYER FOR SEMICONDUCTOR DEVICE PACKAGING

FIELD OF THE INVENTION

The present invention relates generally to the fabrication of semiconductor devices and, in particular, to methods of removing oxidation from surfaces on semiconductor chips, package carriers, and/or solder bumps.

BACKGROUND OF THE INVENTION

Integrated circuits, also known as "ICs" or microchips, are miniaturized electronic circuits that are used in virtually every electronic device constructed today. ICs are constructed by layering various materials (conductors and insulators) by imaging, deposition, and/or etching processes onto a wafer, typically constructed from silicon. Devices of the IC are formed by front-end-of-line processing and back-end-of-line processing is used to form interconnect levels and passive devices in the interconnect levels.

Die cut from the wafer are commonly mounted on a package carrier (such as a substrate, a circuit board, or a leadframe) that provides electrical connections from the die to the exterior of the package carrier. In one such packaging arrangement called flip chip mounting, the die includes an array of electrically conductive contacts, known as bonding pads, that may electrically connected by solder balls or bumps to a corresponding array of bond pads on a substrate, such as a package carrier. Typically, the solder bumps are registered with the bond pads on the die and/or substrate and reflow processes are applied to create electrical connections in the form of solder joints between the die and the substrate. The process of flip chip mounting results in a space or gap between the die and the substrate.

In many of these conventional processes, aluminum or gold has been used for forming the bond pads. However, copper is currently more prevalent because of the costs associated with gold and because copper is a better conductor than aluminum. Still, the use of copper has not been without difficulty because copper readily oxidizes at standard temperature and pressures. Areas of oxidized copper greatly reduce the reliability of the electrical connection by disrupting current flow.

Thus, there remains a need for fabrication methods that improve the reliability of electrical connections made with copper surfaces in semiconductor devices.

SUMMARY OF THE INVENTION

In a representative embodiment of the invention, a method is provided for protecting a copper layer of a semiconductor device. A surface of the layer is cleaned by removing an oxidation layer with a plasma. A polymer layer is formed on the cleaned surface of the layer using a plasma-enhanced deposition process to protect the cleaned surface of the layer against exposure to an oxidizing gas.

In another representative embodiment of the invention, a method is provided for processing a semiconductor device having a bonding pad, the bonding pad having a surface comprised of copper. A surface of the bonding pad is cleaned by removing an oxidation layer with a plasma. A polymer layer is formed on the cleaned surface of the bonding pad using a plasma-enhanced deposition process to protect the cleaned surface of the bonding pad against exposure to an oxidizing gas. An electrical connection is formed with the cleaned surface of the bonding pad.

BRIEF DESCRIPTION OF THE FIGURES

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
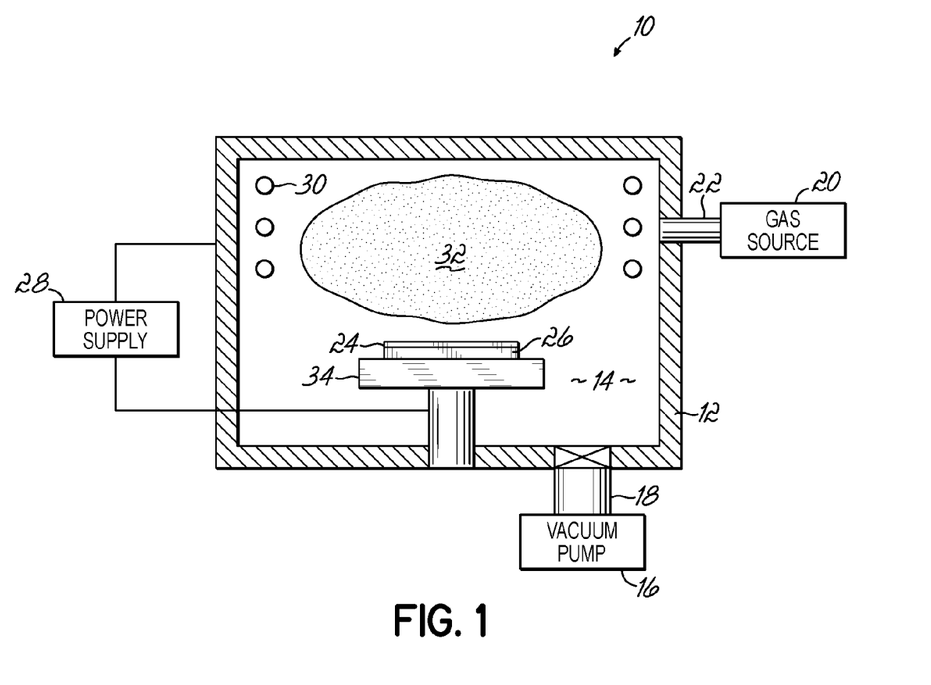
FIG. 1 is a diagrammatic view of a plasma treatment system for plasma processing a semiconductor device in accordance with the principles of the invention.

With reference to the figures, and particularly to FIG. 1, a plasma treatment system 10 is shown and includes a treatment chamber 12 constituted by walls that enclose a processing space 14. During a plasma process, the treatment chamber 12 is sealed fluid-tight from the surrounding ambient environment, evacuated to a suitable partial vacuum, and supplied with at least one process gas that is appropriate for the intended plasma treatment. A vacuum pump 16 is used to evacuate the processing space 14 of the treatment chamber 12 through a valved vacuum port 18. The vacuum pump 16 may comprise one or more vacuum pumping devices with controllable pumping speeds as recognized by persons of ordinary skill in the art of vacuum technology.

One or more process gases are admitted at a regulated flow rate to the processing space 14 from a process gas source 20 through an inlet gas port 22. The flow of process gas from the process gas source 20 to the processing space 14 is typically metered by a mass flow controller (not shown). The gas flow rate from the process gas source 20 and the pumping rate of vacuum pump 16 are adjusted, as needed, to create a plasma-processing pressure that is suitable for plasma generation and the intended treatment process. In this way, fresh process gases are continuously supplied to the processing space 14 when a plasma is present and any spent process gas and/or volatile species removed from a substrate 24 on a substrate support 26 are eliminated.

A power supply 28 is electrically coupled with, and transfers electrical power to, an electrode (referred to herein as an "antenna" 30) that is inside of the chamber 12. Power transferred from the power supply 28 to the antenna 30 is effective for forming a plasma 32 from the process gas confined within the processing space 14. The power supply 28 may also energize an electrode (referred to herein as a "bias electrode" 34) associated with the substrate support 26. Power transferred from the power supply 28 to the bias electrode 34 is effective for electrically biasing the substrate 24 relative to the plasma 32 and promoting the plasma-processing of the substrate 24. The power supply 28 may be one or more power supplies that control a direct current (DC) biasing and/or a radio-frequency (RF) power supply operating at a frequency between about 40 kHz and about 13.56 MHz and a power level ranging between about 4000 watts and about 8000 watts at 40 kHz or 300 watts to 2500 watts at 13.56 MHz. Other appropriate frequencies and power ranges may also be used. Those of ordinary skill in the art will appreciate that different treatment chamber designs may permit or require different bias powers. A controller (not shown) is coupled to the various components of the plasma treatment system 10 to facilitate control of the plasma processes.

The plasma treatment system 10 may assume different configurations understood by those of ordinary skill in the art and, therefore, is not limited to the exemplary configuration described herein. For example, the plasma 32 may be generated remote of the treatment chamber 12 and delivered to the processing space 14. The plasma treatment system 10 is further understood to include components not shown in FIG. 1 and which may be necessary for operation of the system 10, such as a gate valve disposed between the processing space 14 and the vacuum pump 16.

Figure 2A:
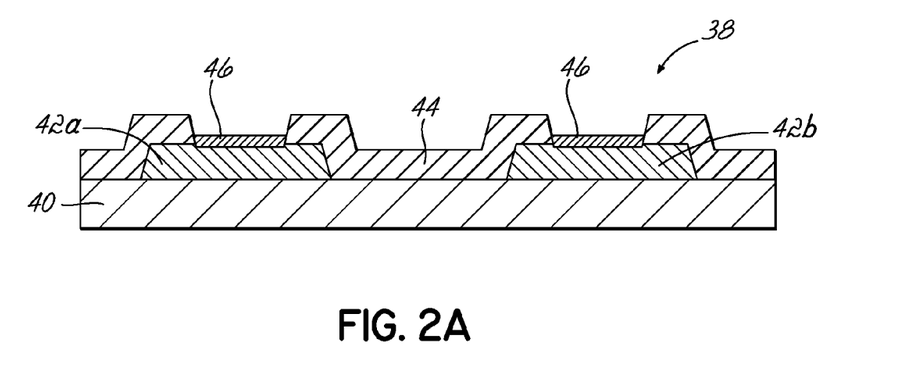
FIGS. 2A, 2B and 2C are diagrammatic views illustrating a procedure process flow for plasma processing a semiconductor device in accordance with an embodiment of the invention.

FIG. 2A illustrates a semiconductor device 38 comprised of a substrate 40, such as a silicon die, having one or more bonding pads such as the representative bonding pads 42a, 42b. The bonding pads 42a, 42 or an uppermost layer of the bonding pads 42a, 42 are comprised of a layer of material, such as copper, that readily oxidizes when exposed to oxygen. Respective surfaces 43a, 43b of the bonding pads 42a, 42 are exposed for establishing electrical connections with the integrated circuits and other devices of the semiconductor device 38. The surfaces 43a, 43b of the bonding pads 42a, 42b may be partially covered by a passivation layer 44. The passivation layer 44 may be comprised of an electrical insulator, such as a polyimide.

Because the surfaces 43a, 43b of the bonding pads 42a, 42b used for establishing electrical connections remain partially exposed after passivation, once the semiconductor device 38 is removed from the environment (not specifically shown, but may be similar to the plasma treatment system 10 of FIG. 1) used to form layer 44 and exposed to atmospheric conditions, the respective surfaces 43a, 43b of the bonding pads 42a, 42b may undergo oxidation from the exposure. Oxidation 46 forms as a layer on the bonding pads 42, 42b and, if not removed, may interfere with wire bonding or reflow processing and may also operate to decrease device reliability. The oxidation 46 may include areas of oxidized copper that, if not removed, would reduce the reliability of electrical connections with the bonding pads 42a, 42b by disrupting current flow.

With reference now to FIGS. 1 and 2A-2C and in accordance with an embodiment of the invention, the semiconductor device 38 is processed to remove the oxidation 46 from the bonding pads 42a, 42b and to prevent re-oxidation of the cleaned surfaces 43a, 43b of the bonding pads 42a, 42b. The process may be used to clean and protect other types of copper layers of the semiconductor device 38.

Figure 3A:
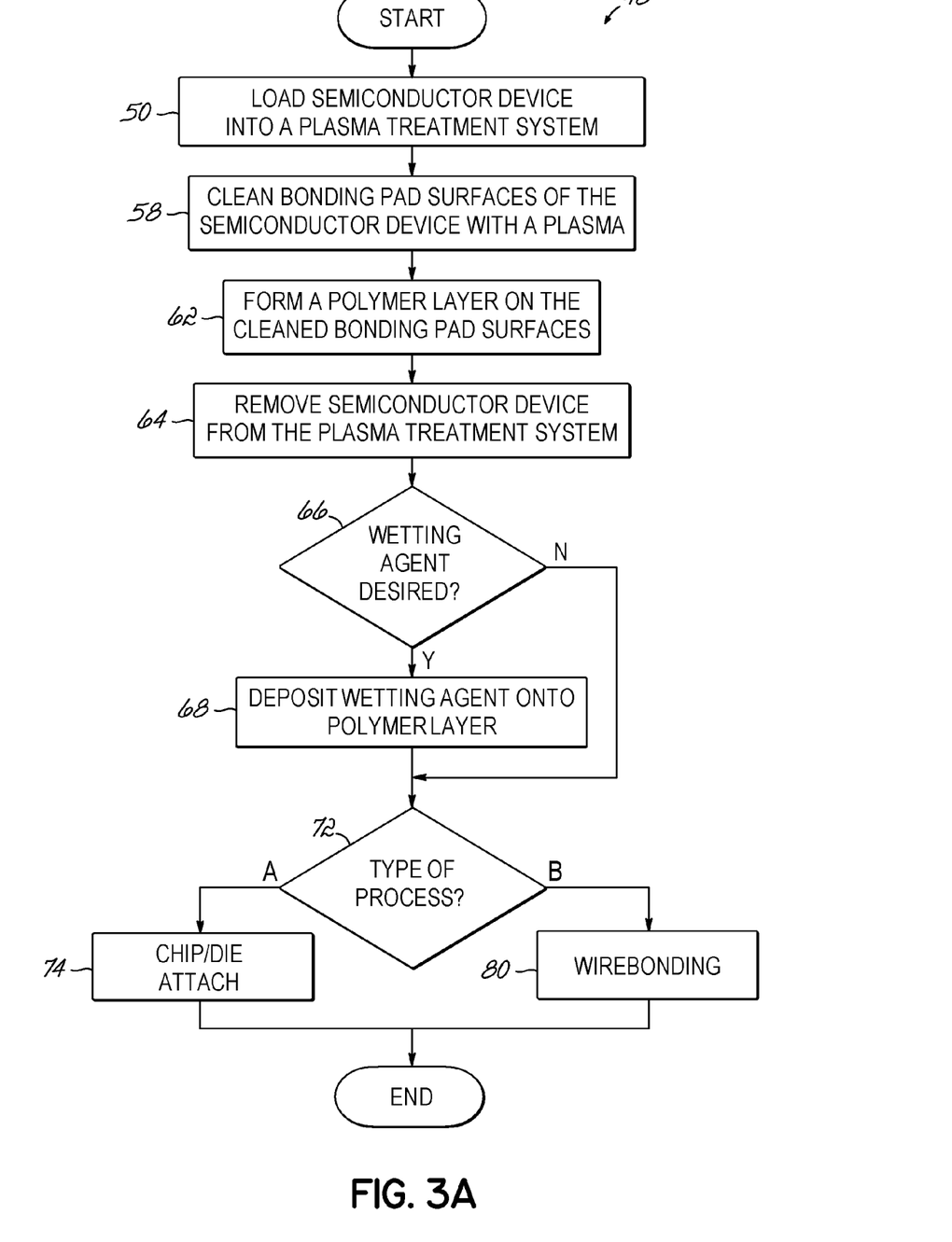
FIG. 3A is a flowchart illustrating plasma processing of a semiconductor device in accordance with an embodiment of the invention and establishing electrical connections with the plasma-treated semiconductor device.

FIG. 3A is a flowchart 48 illustrating a process flow for plasma processing the semiconductor device 38. The semiconductor device 38 is loaded into the plasma treatment system 10 by placing the semiconductor device 38 onto the substrate support 26 in the processing chamber 14 (block 50).

The bonding pads 42a, 42b of the semiconductor device 38 constitute copper layers that are covered with oxidation 46 as shown in FIG. 2A. When the semiconductor device 38 is loaded, the vacuum pump 16 evacuates the chamber 12 and a process gas is introduced into the processing space 14 from the process gas source 20 while the controller adjusts the operation of the vacuum pump 16 and the gas introduction in order to maintain a desired processing pressure. RF power ranging from about 0.02 $W/cm^2$ to about 0.65 $W/cm^2$ is supplied from the power supply 28 to the antenna 30, which energizes the process gas within the processing space 14 into the plasma 32.

Figure 2B:
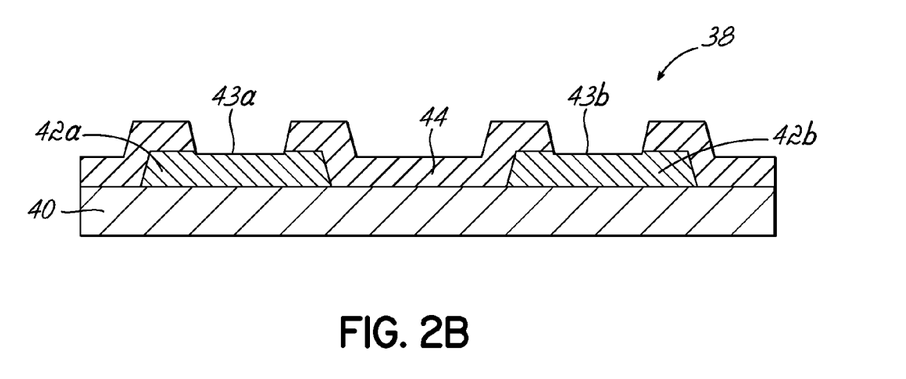

While the plasma 32 is ignited, the power supply 28 also supplies DC power to the bias electrode 34 to bias one or more species of ions from the plasma 32 and toward the now biased semiconductor device 38. The plasma 32 cleans the surfaces 43a, 43b of the bonding pads 42a, 42b by removing the oxidation 46 (block 58). In one embodiment, the process gas may be a mixture of argon (Ar) and hydrogen ($H_2$) in which Ar physically etches the oxidation 46 on the surfaces 43a, 43b by sputtering and H chemically reduces the oxidation 46 on the surfaces 43a, 43b. The cleaned surfaces 43a, 43b of the bonding pads 42a, 42b and the absence of the oxidation layer 46 are depicted in FIG. 2B.

The oxygen-depleted environment of the chamber 12 preserves the cleaned surfaces 43a, 43b against reoxidation while the device 10 resides inside the chamber 12. A polymer layer 61 (FIG. 4) is formed on the cleaned surfaces 43a, 43b of the bonding pads 42a, 42b as protection against reoxidation when device 10 is removed from the chamber 12 and exposed to the ambient atmospheric environment that contains oxygen (block 62). The polymer layer 61 is also formed on the passivation layer 44.

To that end, the process gas flow for the plasma is adjusted and/or changed. For example, the introduction of $H_2$ gas may be stopped and a process gas suitable to form the polymer layer 61 may be introduced. The process gas may be a monomer gas such as siloxanes or, in one embodiment, tetramethyldisiloxane ("TMDSO"). TMDSO may be introduced by supplying liquid TMDSO in a separate evaporation chamber (not shown specifically, but included within the gas source 20) that is fluidically coupled to the processing space 14. Because the vapor pressure of TMDSO is 112.5 mTorr at 20° C., once a suitable process pressure is established inside chamber 12, TMDSO will readily evaporate and enter the processing space 14 at flow rates that range from about 1 sccm to about 1000 sccm. In an alternative embodiment, a carrier gas may be used for transporting the monomer vapor to the processing space 14 as is well known to those of ordinary skill in the art and would be considered to be consistent with the embodiments of the invention. The process pressure in chamber 12 may be kept in a range from about 20 mTorr to about 200 mTorr as the TMDSO is introduced.

The TMDSO in plasma 32 forms the polymer layer 61 on the surfaces 43a, 43b of the semiconductor device 38. With deposition of the polymer layer 61 complete (film thickness ranging from about 10 nm to about 500 nm), the introduction of the process gas is stopped, the plasma processing ends, and the semiconductor device 38 is removed from the plasma treatment system 10 (block 64). The thickness and/or composition of the material comprising the polymer layer 61 are selected to reduce and, preferably function as a barrier to prevent, the diffusion of an oxidizing gas, such as oxygen from the ambient atmospheric environment, to the cleaned surfaces 43a, 43b. With the respective exposed surfaces 43a, 43b of the bonding pads 42a, 42b now clean and free of copper oxides as well as passivated by the polymer layer 61, bonding may occur without interference due to oxidized copper provided that the cleaned surfaces 43a, 43b are protected against reoxidation. The polymer layer 61 covering the cleaned surfaces 43a, 43b of the bonding pads 42a, 42b is apparent in FIG. 2C.

Figure 4:
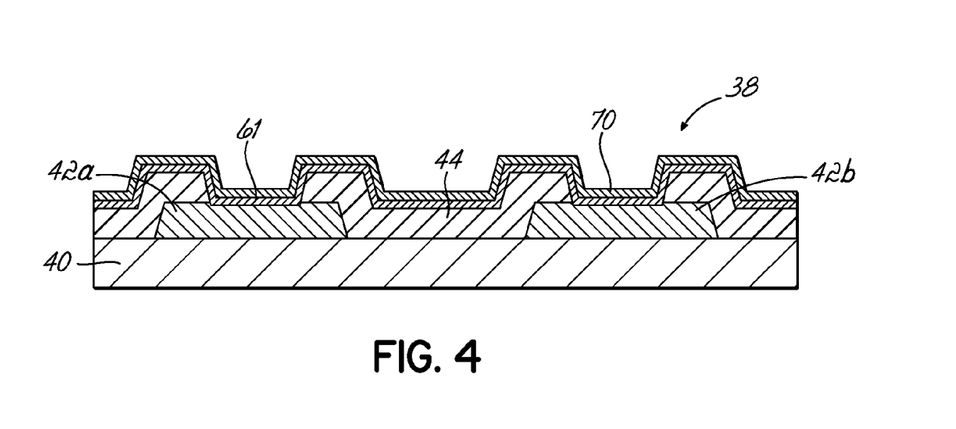
FIG. 4 is a diagrammatic view of the plasma processed semiconductor device of FIG. 2C having a wetting agent layer deposited thereon.

Turning now to FIG. 4, and with continued reference to FIG. 3A, a wetting agent 70 may be deposited onto the surface of the polymer layer 61 in preparation of another processing step (block 66). However, the contact angle of the surface of the polymer layer 61 may be too large to yield a uniform deposition of a particular wetting agent layer onto the semiconductor device 38. Therefore, if a wetting agent, such as flux, is desired ("Yes" branch of block 66), then the surface of the polymer layer 61 may be modified to decrease the contact angle (to a range of about 80° to about 90°) and prepare the surface for the wetting agent 70. While not specifically shown, this modification may occur by a plasma-enhanced process where the surface of the polymer layer is oxidized. According to one embodiment, the process gas flow is again adjusted and/or changed. Specifically, the adjustment or change in the process gas flow may include halting the introduction of TMDSO monomer, and introducing oxygen ($O_2$) for the purpose of generating a plasma that at least partially oxidizes the exposed surface of the polymer layer 61 and lowers the contact angle without removing the polymer layer 61 or causing the surfaces 43a, 43b to be exposed. The wetting agent 70 may then be deposited onto the surface of the polymer layer 61 (block 68). The wetting agent 70 may be deposited by a liquid dispensing unit such as the one described in U.S. Pat. No. 7,441,568, issued on Oct. 28, 2008 and entitled "Rechargeable Dispensing Head," the disclosure of which is incorporated herein by reference, in its entirety. If the wetting agent 70 is not required or desired, then the process may continue without the deposition step ("No" branch of block 66).

Figure 5A:
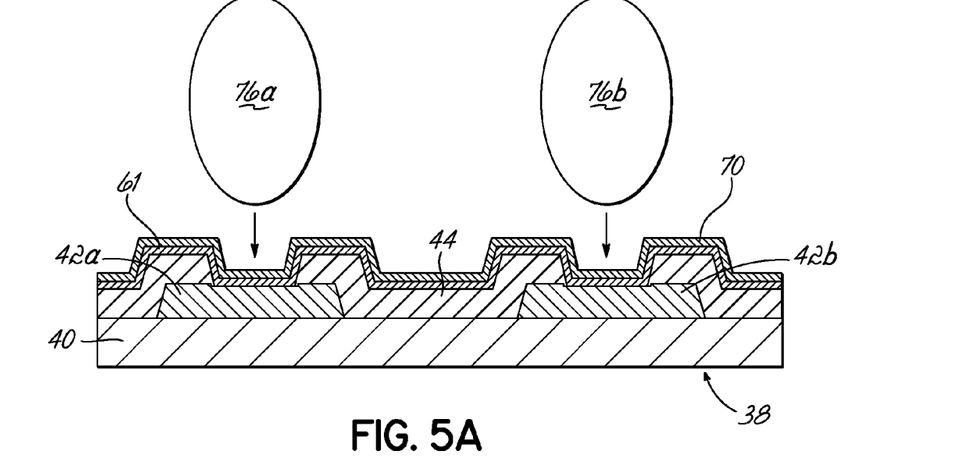
FIGS. 5A and 5B are diagrammatic views of the semiconductor device undergoing a reflow process.
Figure 5B:
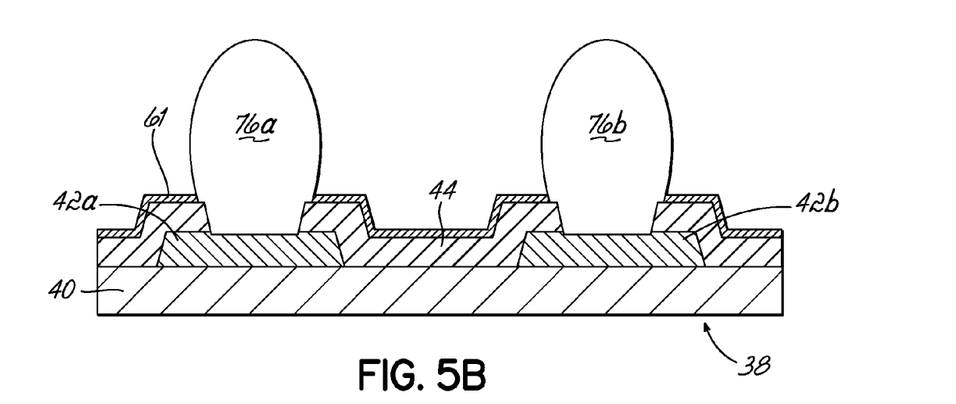

The semiconductor device 38 is then ready for an attachment process, as desired, that provides electrical connections that extend through the polymer layer 61 to the cleaned surfaces 43a, 43b. Accordingly, a type of attach process is determined (block 72 in FIG. 3A). For purposes of illustration only, a flip chip type of attachment process is described and shown in connection with FIGS. 5A and 5B ("A" branch of block 72 in FIG. 3A). Flip chip attachment processes include, but are not limited to, a thermo-compression bonding process or a thermal bonding process. In any event, as shown a mold tray (not shown) carrying solder bumps 76a, 76b is aligned with the bonding pads 42a, 42b, respectively. The solder bumps 76a, 76b are registered with the bonding pads 42a, 42b and advanced onto the semiconductor device 38 as shown in FIG. 5A. With sufficient pressure and temperature, which is contingent on the wetting agent composition but typically ranges from about 200° C. to about 300° C., the wetting agent 70 dissipates at the area of the bonding pads 42a, 42b, the polymer layer 61 decomposes, and the solder bumps 76a, 76b reflow to contact with the respective bonding pad 42a, 42b (block 74), as shown in FIG. 5B. Because layer is absent, the reliability of the electrical connection between the solder bumps 76a, 76b and the bonding pads 42a, 42b is greatly enhanced.

Alternatively, a wirebonding process may proceed ("B" branch of block 72 in FIG. 3A) that does not rely upon the use of solder bumps 76a, 76b. While not specifically shown, the bonding of wires onto the bonding pads 42a, 42b may occur in a manner that is generally known to those of ordinary skill in the art and in a manner that is consistent with the above description (block 80 in FIG. 3A). Specifically, the heat and pressure associated with the soldering or welding process causes the polymer layer 61 to decompose at the area of contact formation.

Figure 5C:
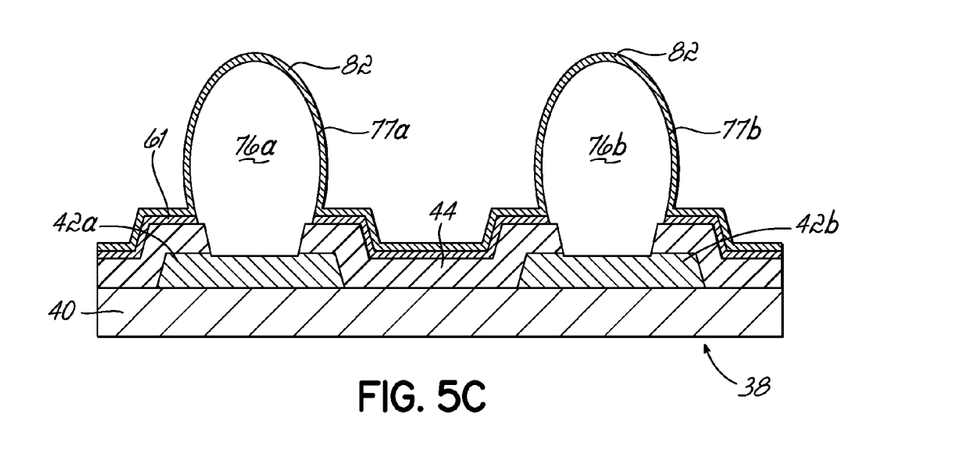
FIG. 5C is a diagrammatic view of the semiconductor device after the reflow process of FIG. 5B with the copper-based solder bump passivated in accordance with an embodiment of the invention.

In some embodiments, the solder bumps 76a, 76b may be comprised of copper or a copper alloy. Thus, the exposed surfaces 77a, 77b of the solder bumps 76a, 76b may be oxidized in a manner similar to the oxidation of the bonding pads 42a, 42b (FIG. 2A) that was described above. Thus, the semiconductor device 38 of FIG. 5B may be plasma processed to remove the oxidation and apply a polymer layer in a manner that is consistent with one or more embodiments of the present invention. For example, the semiconductor device 38 may be loaded into the plasma treatment system 10 (FIG. 1) and plasma-treated to remove the oxidation and clean the surfaces 77a, 77b of the solder bumps 76a, 76b, and to deposit a second polymer layer 82 onto the surfaces 77a, 77b of the solder bumps 76a, 76b, as shown in FIG. 5C. The second polymer layer 82 prevents the re-oxidation of the respective surfaces 77a, 77b of the solder bumps 76a, 76b after removal from the plasma treatment system 10 and preserves the integrity of the solder bumps 76a, 76b until further processing is desired.

Figure 2C:
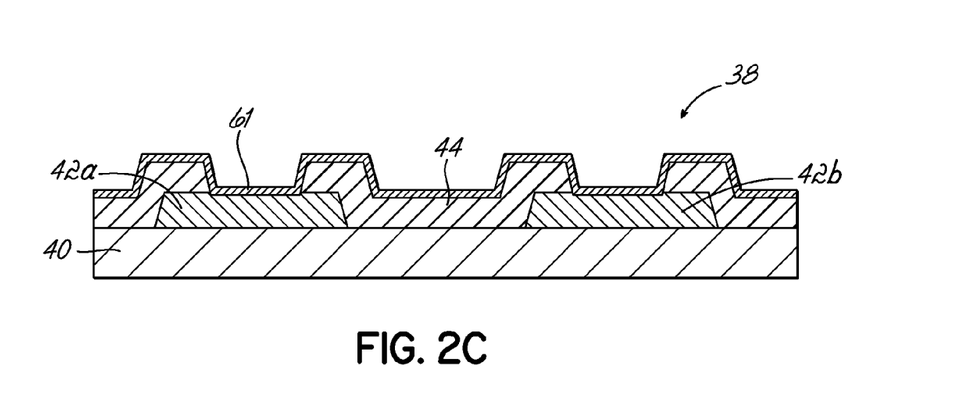

While the representative embodiment is directed to a die after front-end-of-line and back-end-of-line processing as the semiconductor device 38, the cleaning and passivation process may be used to clean and passivate copper layers or copper bonding pads of different constructions than bonding pads 42a, 42b or to clean and passivate copper layers or copper bonding pads on different types of semiconductor devices than the semiconductor device 38 illustrated in FIGS. 2A-C.

The die constituting semiconductor device 38 is typically joined with a substrate, such as a lead frame or a ball grid arrays (B GA), that may also have copper layers on bonding pads complementary to the bonding pads 42a, 42b of the die. The cleaning and passivation process described herein for device 38 may also be used to clean and passivate copper layers or copper bonding pads on the substrate. Alternative, only the copper layers or copper bonding pads on the substrate may be cleaned and passivated as described herein for device 38.

The solder bumps 76a, 76b may be applied only to the copper layers or bonding pads on the die, only to the copper layers or bonding pads on the substrate, or to both the copper layers or bonding pads on the die and the copper layers or bonding pads on the substrate. In each instance, the solder bumps 76a, 76b may be cleaned and passivated after application to the die and/or the substrate as described herein.

Figure 6A:
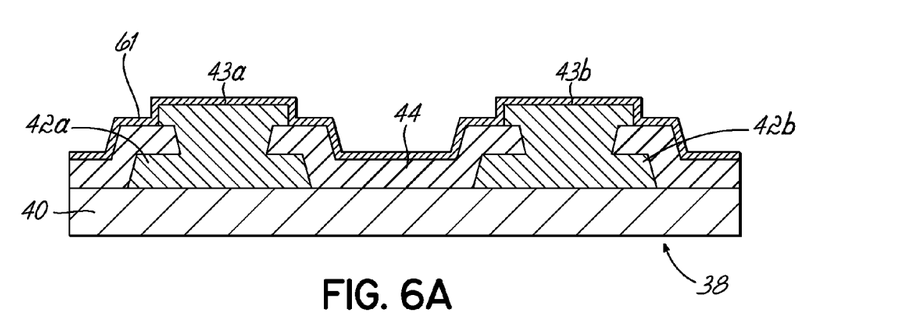
FIGS. 6A-C are diagrammatic views similar to FIGS. 2A-C illustrating a semiconductor device with a different type of copper layer cleaned and passivated in accordance with an embodiment of the invention.
Figure 6B:
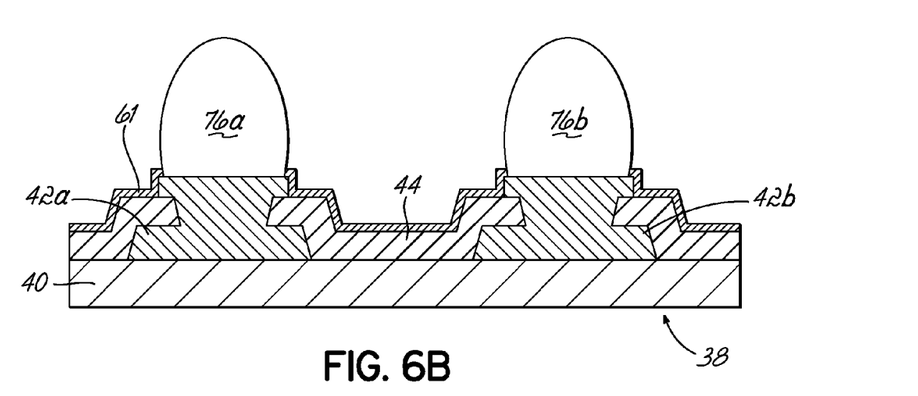
Figure 6C:
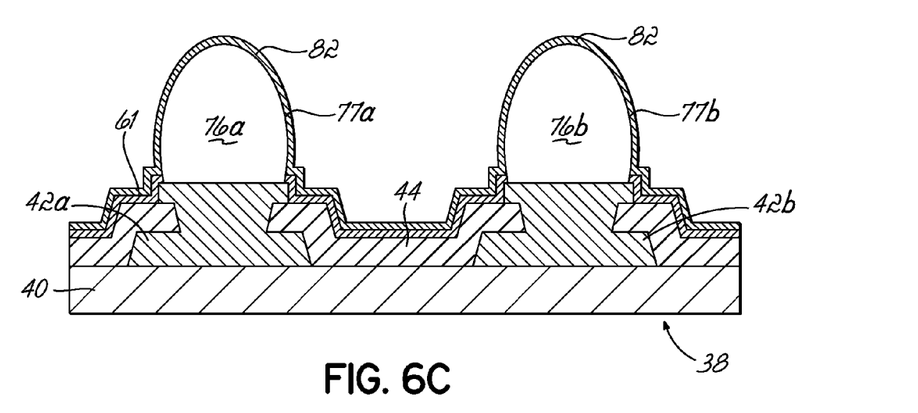

As an example of a change in construction and with reference to FIG. 6A, the bonding pads 42a, 42b may be shaped as pillars with surfaces 43a, 43b that are cleaned as described herein. The cleaned pillars serving as bonding pads 42a, 42b may be coated with a polymer layer 61, as also described herein. The cleaned and passivated bonding pads 42a, 42b may be used to form an assembly in which the complementary semiconductor device (e.g., a lead frame) carries solder bumps. Alternatively, solder bumps 76a, 76b may be applied to the cleaned and passivated bonding pads 42a, 42b as shown in FIG. 6B. The surfaces 77a, 77b of the solder bumps 76a, 76b may be cleaned and passivated as also described herein and as shown in FIG. 6C.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Furthermore, to the extent that the terms "includes", "having", "has", "with", "composed of" or variants thereof are used in either the detailed description or the claims, such terms are intended to be inclusive in a manner similar to the term "comprising."

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

References herein to terms such as "vertical", "horizontal", etc. are made by way of example, and not by way of limitation, to establish a frame of reference. It is understood that various other frames of reference may be employed without departing from the spirit and scope of the invention.

While the invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described.

What is claimed is:

1. A method of processing a semiconductor device having a bonding pad, the bonding pad having a surface comprised of copper, comprising:
   cleaning the surface of the bonding pad by removing an oxidation layer from the copper with a plasma;
   forming a polymer layer on the cleaned surface of the bonding pad using a plasma-enhanced deposition process to protect the cleaned surface of the bonding pad against exposure to an oxidizing gas;
   attaching a solder bump comprising copper to the bonding pad to form an electrical connection with the cleaned surface of the bonding pad;
   cleaning an exterior surface of the solder bump by removing an oxidation layer with a plasma; and
   forming a polymer layer on a cleaned exterior surface of the solder bump using a plasma-enhanced deposition process to protect the cleaned exterior surface of the solder bump against the exposure to an oxidizing gas.

2. The method of claim 1 further comprising:
   after the surface of the bonding pad is cleaned and before the polymer layer is formed, maintaining the cleaned surface of the bonding pad in an oxygen-depleted environment to prevent oxidation of the cleaned surface.

3. The method of claim 2 wherein the polymer layer is formed using a siloxane monomer in the plasma-enhanced deposition process.

4. The method of claim 3 wherein the siloxane monomer is tetramethyldisiloxane.

5. The method of claim 3 wherein the siloxane monomer is supplied at a flow rate ranging from about 1 sccm to about 1000 sccm, and a process pressure for the plasma-enhanced deposition ranges from about 20 mTorr to about 200 mTorr.

6. The method of claim 1 further comprising:
   after the exterior surface of the solder bump is cleaned and before the polymer layer is formed on the cleaned exterior surface of the solder bump, maintaining the cleaned exterior surface of the solder bump in an oxygen-depleted environment to prevent oxidation of the cleaned surface.

7. The method of claim 6 wherein the polymer layer is formed on the cleaned exterior surface of the solder bump using a siloxane monomer in the plasma-enhanced deposition process.

8. The method of claim 7 wherein the siloxane monomer is tetramethyldisiloxane.

9. The method of claim 7 wherein the siloxane monomer is supplied at a flow rate ranging from about 1 sccm to about 1000 sccm, and a process pressure for the plasma-enhanced deposition ranges from about 20 mTorr to about 200 mTorr.

10. The method of claim 1 wherein the electrical connection extends through the polymer layer to the cleaned surface of the bonding pad.

11. The method of claim 2 further comprising:
    after the exterior surface of the solder bump is cleaned and before the polymer layer is formed on the cleaned exterior surface of the solder bump, maintaining the cleaned exterior surface of the solder bump in an oxygen-depleted environment to prevent oxidation of the cleaned surface.

* * * * *